United States Patent
Mishima et al.

(10) Patent No.: US 8,268,182 B2
(45) Date of Patent: Sep. 18, 2012

(54) PRODUCT HAVING THROUGH-HOLE AND LASER PROCESSING METHOD

(75) Inventors: Hidehiko Mishima, Osaka (JP); Yasuhiro Okuda, Osaka (JP); Shuji Sakabe, Uji (JP); Masaki Hashida, Uji (JP); Seiji Shimizu, Uji (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 794 days.

(21) Appl. No.: 12/301,666

(22) PCT Filed: May 17, 2007

(86) PCT No.: PCT/JP2007/060148
§ 371 (c)(1),
(2), (4) Date: Nov. 20, 2008

(87) PCT Pub. No.: WO2007/135955
PCT Pub. Date: Nov. 29, 2007

(65) Prior Publication Data
US 2009/0151996 A1    Jun. 18, 2009

(30) Foreign Application Priority Data
May 20, 2006 (JP) ................................ 2006-140967

(51) Int. Cl.
*B44C 1/22* (2006.01)
*H01B 13/00* (2006.01)
*B23K 26/00* (2006.01)

(52) U.S. Cl. .... 216/65; 216/17; 219/121.6; 219/121.68; 219/121.71

(58) Field of Classification Search .................... 216/17, 216/65; 219/121.6, 121.68, 121.71
See application file for complete search history.

(56) References Cited

U.S. PATENT DOCUMENTS

| | | | |
|---|---|---|---|
| 5,208,604 A | 5/1993 | Watanabe et al. | |
| 5,208,980 A * | 5/1993 | Hayes | 29/890.1 |
| 5,609,746 A | 3/1997 | Farrar et al. | |
| 5,646,657 A * | 7/1997 | Aoki | 347/45 |
| 6,063,476 A * | 5/2000 | Kinoshita | 428/131 |
| 6,359,255 B1 * | 3/2002 | Yamamoto et al. | 219/121.71 |
| 2001/0008234 A1 | 7/2001 | Hasegawa et al. | |
| 2005/0242059 A1* | 11/2005 | Brennen et al. | 216/41 |
| 2008/0189943 A1* | 8/2008 | Hirose et al. | 29/852 |

FOREIGN PATENT DOCUMENTS

EP    0 706 309 A    4/1996

(Continued)

OTHER PUBLICATIONS

European Search Report issued in European Patent Application No. 07743583.2-1262, dated Jan. 17, 2011.

(Continued)

*Primary Examiner* — Shamim Ahmed
(74) *Attorney, Agent, or Firm* — McDermott Will & Emery LLP (57) ABSTRACT

A processing method of forming a through-hole in a workpiece by means of a pulsed laser beam includes the steps of providing a removable sacrifice layer on the workpiece, forming a through-hole in the workpiece by the laser beam in a state where the sacrifice layer is provided, and removing the sacrifice layer from the workpiece after the step of forming the through-hole.

3 Claims, 10 Drawing Sheets

TAPER ANGLE = Arctan{(0.5Da−0.5Db)/d}

FOREIGN PATENT DOCUMENTS

| | | |
|---|---|---|
| EP | 0 867 294 A2 | 9/1998 |
| EP | 0 968 824 A1 | 1/2000 |
| JP | 1-262087 | 10/1989 |
| JP | 2-187345 | 7/1990 |
| JP | 10-146981 | 6/1998 |
| JP | 2000-077824 | 3/2000 |
| JP | 2005-211962 | 8/2005 |
| WO | WO 99/59761 | 11/1999 |

OTHER PUBLICATIONS

Replacement European Search Report issued in European Patent Application No. 07743583.2-1262, dated Feb. 23, 2011.
US Office Action issued in U.S. Appl. No. 13/226,029 dated Dec. 13, 2011.

* cited by examiner

TAPER ANGLE = Arctan{(0.5Da−0.5Db)/d}

FIG.13 d: FILM THICKNESS [μm] (WITHOUT SACRIFICE LAYER)

FIG.14
INVENTION'S EXAMPLE C

(UNIT: μm)

FIG.15
INVENTION'S EXAMPLE D (UNIT: μm)

FIG.16

Ti FRONT SURFACE

Ti REAR SURFACE

PRODUCT HAVING THROUGH-HOLE AND LASER PROCESSING METHOD

RELATED APPLICATIONS

This application is the U.S. National Phase under 35 U.S.C. §371 of International Application No. PCT/JP2007/060148, filed on May 17, 2007, which in turn claims the benefit of Japanese Application No. 2006-140967, filed on May 20, 2006, the disclosures of which Applications are incorporated by reference herein.

TECHNICAL FIELD

The present invention relates to a product having a through-hole processed by a pulsed laser, and to a laser processing method.

BACKGROUND ART

Figure 10:
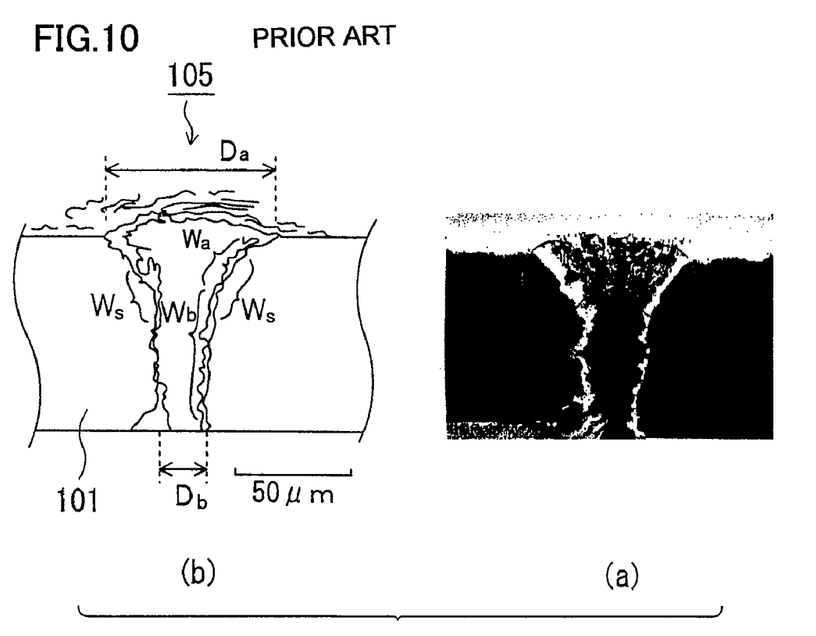
FIG. 10 is a diagram showing a longitudinal cross section of a product having a through-hole formed by a titanium-sapphire laser (conventional example), where (a) shows an SEM image of the cross section and (b) shows a schematic illustration thereof.
Figure 11:
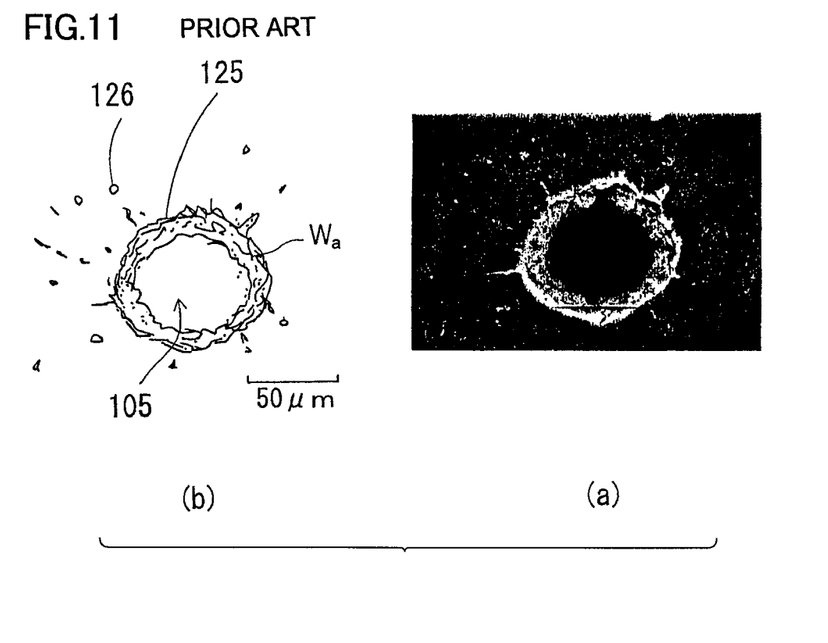
FIG. 11 is a diagram showing a front surface of the product having the through-hole in FIG. 10, where (a) shows an SEM image of a cross section and (b) shows a schematic illustration thereof.

In a wiring board such as a multilayered high-density wiring board, through-holes have conventionally been formed with a mechanical process using a drill or the like. However, the mechanical processing is not readily applicable under the recent circumstances in which the wiring density is increased, the diameter of though-hole is made smaller, and the pitch between through-holes is also made smaller in the wiring board. For the purposes of solving these problems and further improving the processing efficiency, there is a tendency to employ laser processing with a laser beam. In the case that a pulsed laser is used to form a through-hole, however, the through-hole has a tapered shape as shown in FIG. 10 (a), (b), causing a problem of defective plating for example. Furthermore, scattered fragments, burrs and the like are generated as shown in FIG. 11 (a), (b), causing a problem of increase in number of processes for rework, for example. In order to solve these problems, it is desired to develop a high-precision technique for forming through-holes by means of a pulsed laser. As for FIG. 10 (a), (b) and FIG. 11 (a), (b), a detailed description will be given in connection with Examples.

In order to meet the requirements as described above, there have been proposed laser processing methods improved in accuracy. For example, there is a proposed method in which a laser beam is applied to each of the surfaces of a workpiece in a process of forming a through-hole, so as to make the through-hole straight-like (approach to a right circular cylinder, or reduction in taper angle) (Patent Document 1). With this method, the diameters on the front and back sides of through-hole can be made almost equal to each other. Thus, it becomes possible to reduce the taper angle of through-hole and then to form a straight-like through-hole.

There is another proposed processing method that utilizes coherent laser light reflected from a workpiece in a laser ablation process so as to make it possible to readily form a through-hole having a reduced difference between the diameters on its front and back sides (Patent Document 2). With this method, the reflected light can increase the energy density of light used for processing and change the shape of through-hole, whereby making it possible to arrange through-holes at a high density.

Patent Document 1: WO99/59761
Patent Document 2: Japanese Patent Laying-Open No. 2000-77824

DISCLOSURE OF THE INVENTION

Problems to be Solved by the Invention

According to the method disclosed in Patent Document 1 as described above, (1) the application of beams to both of the front and back surfaces requires enormous efforts because of difficulty in positional matching between the front and the back surfaces; (2) the tapered shape peculiar to the laser processing still remains whereby causing formation of a through-hole having non-straight-like sectional shape and a reduced diameter in its middle portion; and (3) burrs are generated due to the laser processing, whereby necessitating a process for removing the burrs.

Further, according to the method disclosed in Patent Document 2, (1) the use of a photomask complicates the process of forming a hole; and (2) the process control is difficult because intensity of the reflected beam varies depending on the material of workpiece and some materials are not reflective. Further, as described above, (3) burrs are generated due to the laser processing, whereby necessitating a process for removing the burrs.

An object of the present invention is to provide a simplified laser processing method that can reduce the taper angle and can prevent generation of burrs and attachment of scattered fragments, and then provide a product having a through-hole formed by using the laser processing method.

Means for Solving the Problems

A laser processing method of the present invention refers to a processing method for forming a through-hole in a workpiece by means of a pulsed laser beam. The processing method includes the steps of providing a removable sacrifice layer on the workpiece, forming a through-hole in the workpiece by the laser beam in a state where the sacrifice layer is provided, and removing the sacrifice layer from the workpiece after the step of forming the through-hole.

By providing the sacrifice layer before the laser processing and removing the same after the laser processing as described above, it becomes possible to easily reduce the taper angle of through-hole due to the laser processing. Therefore, it becomes possible to open a substantially straight-like through-hole (taperless). Further, it also becomes possible to completely remove attached scattered fragments as well as protruded portions such as burrs that are always generated in the laser processing. The sacrifice layer may be made of the same material as or a material different from the material of workpiece.

The material of workpiece can be metal or organic polymer material, or titanium or fluorine compound, and may have a porous structure. The reason of this is that the above-described manufacturing method can be used to relatively easily open a straight-like through-hole in a workpiece of any of the above-mentioned materials such as the fluorine compound having the porous structure (in which it is usually difficult to form a straight-like through-hole).

The ablation threshold value of the sacrifice layer may be selected to be not less than that of the workpiece. In virtue of this feature, it is possible to ensure the effects achieved by providing the sacrifice layer. If the ablation threshold value of the sacrifice layer is smaller than that of the workpiece, the preferable effects due to provision of the sacrifice layer is reduced because a large hole is formed in the sacrifice layer.

Further, the sacrifice layer may include a plurality of layers. For example, in the case that the ablation threshold value of workpiece is considerably large and the thickness of the film cannot be increased, it is possible to use a combined structure in which a sacrifice layer of the same material as that of the workpiece is provided as a top layer and a material having a relatively smaller ablation threshold value is provided as an underlying layer. Furthermore, the material for the sacrifice layer may be selected from a wider variety of materials depending on other conditions.

It is preferable to carry out the processing so as to satisfy a relation: $(\theta \times d^{0.68})/\phi \leq 4.0$ where $\phi$ (μm) denotes the diameter of laser beam, $\theta$ (°) denotes the taper angle of through-hole and d (μm) denotes the thickness of workpiece. The taper angle of through-hole depends on the thickness of workpiece and the diameter of laser beam. Therefore, the processing conditions may be set to satisfy the above-described relation so that a straight-like through-hole can be obtained. Laser beam diameter $\phi$ refers to the diameter at the front surface of the base film after the sacrifice layer is removed. Here, the above-described expression is derived from experimental data, and details thereof will be described in connection with Example 2.

A product having a through-hole according to the present invention refers to a product having a through-hole formed by a pulsed laser. This product has a feature that $(\theta \times d^{0.68})/\phi \leq 4.0$ is satisfied where $\phi$ (μm) denotes the diameter of pulsed laser, $\theta$ (°) denotes the taper angle of through-hole and d (μm) denotes the thickness of product. Here, the taper angle refers to an average taper angle determined form diameters at the front and rear surfaces of the hole on a supposition that there is a common axis line, namely axisymmetry. By virtue of this feature, in a process of forming an electrically conductive portion in a thickness direction of a multilayer board that is recently required to have a higher wiring density, for example, it becomes possible to prevent defective plating on the through-hole wall surface and form the conductive portion for highly reliable electrical connection.

Another product having a through-hole according to the present invention also refers to a product having a through-hole formed by a pulsed laser. This product has a feature that the through-hole is straight-like in shape. Here, the straight-like through-hole refers to a right-cylindrical through-hole. More specifically, the straight-like through-hole refers to a through-hole in the shape of a right cylinder or a through-hole whose wall surface does not include a curved portion in which the wall has an inwardly convex surface such that the diameter at one end of the through-hole becomes larger, as described hereinlater. In general, the wall surface of through-hole formed by a pulsed laser is curved to be inwardly convex in a longitudinal cross section, causing a problem such as defective plating in producing a wiring board, which is one factor of deterioration in reliability. In contrast, the straight-like through-hole as described above can prevent defective plating of a wiring board or the like and can ensure an electrically conductive portion for highly reliable electrical connection.

A still another product having a through-hole according to the present invention also refers to a product having a through-hole formed by a pulsed laser. This product has a feature that the wall surface of through-hole does not include a curved portion in which the wall has an inwardly convex surface such that the diameter at one end of the through-hole becomes larger. By virtue of this structure, it becomes possible to produce a highly reliable wiring board or the like.

All of the above-described products having their respective through-holes can be produced without protrusions at peripheries of openings of the through-holes. By virtue of this feature, it becomes easy to carry out a post process in fabrication of an electronic device on a multilayer wiring board or the like, for example. Here, the protrusions are mainly formed by burrs.

Moreover, it is also possible to avoid attachment of scattered fragments due to laser ablation on both surfaces where the through-hole is open. With this feature, it becomes possible to improve the reliability of the multilayer wiring board or the like, for example.

Effects of the Invention

The present invention can provide a product having a straight-like through-hole and a laser processing method that can reduce a taper angle and avoid burrs and attachment of scattered fragments on the product. Therefore, the invention can prevent defective plating on a through-hole wall surface in a multilayer board and can contribute to supply of highly reliable multilayer boards and the like.

DESCRIPTION OF THE REFERENCE SIGNS 1 workpiece, 1a sacrifice layer, 1b base film, 5 through-hole, 10 product having a through-hole, W through-hole wall surface, Wa through-hole portion (wall) where the diameter expands as approaching the front side, Wb straight-like through-hole portion (wall), Ws curved portion (wall), Da diameter (larger diameter) at a front surface, Db diameter (smaller diameter) at a rear surface, d base film (product) thickness, t sacrifice layer thickness, 105 through-hole, 125 burr, 126 scattered fragment.

BEST MODES FOR CARRYING OUT THE INVENTION

Embodiments of the present invention will now be described with reference to the drawings.

(Principle of the Present Invention)

Figure 1:
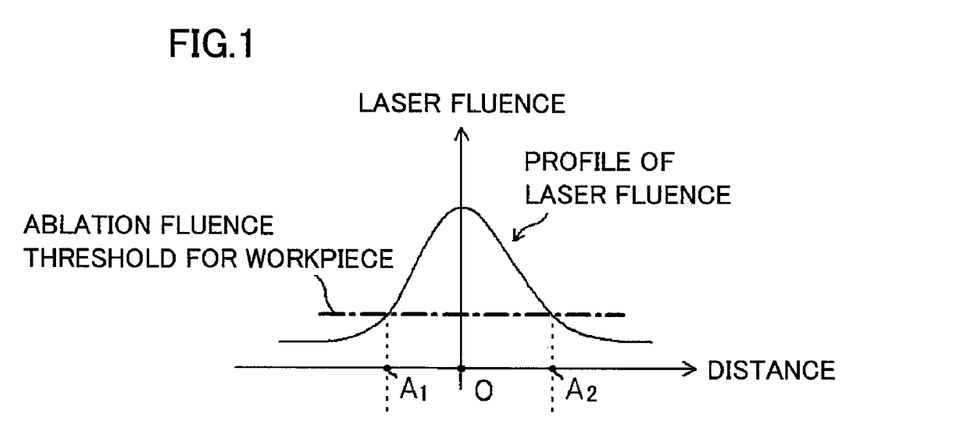
FIG. 1 is a diagram showing a spatial distribution of energy density in a laser beam cross section.
Figure 2:
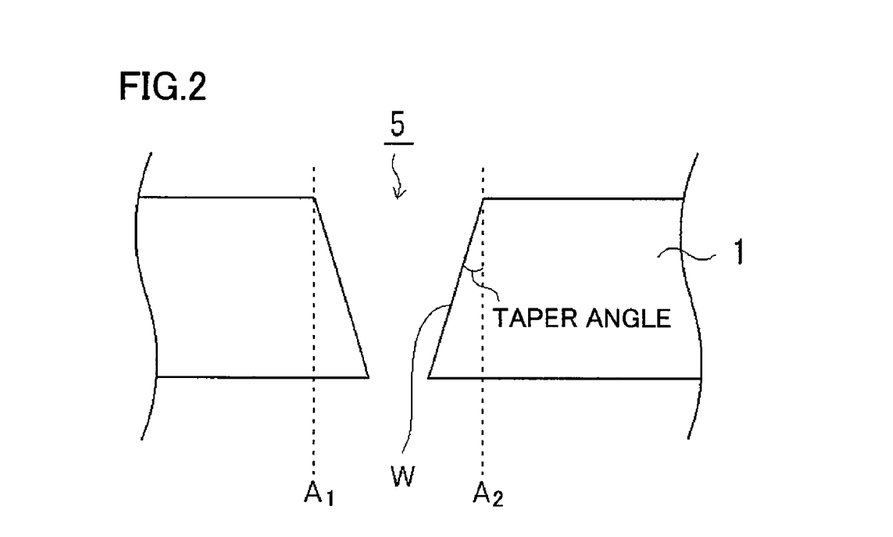
FIG. 2 is a schematic diagram qualitatively showing a shape of an opening formed by a laser beam.

The laser fluence (energy density) of a pulsed laser beam shows a spatial distribution in which it is high at a central portion and low at a peripheral portion, or generally shows a Gaussian distribution, as shown in FIG. 1. Therefore, supposing that O represents the center position of the beam and $A_1$ and $A_2$ represent positions where the laser fluence is equal to the threshold value of the ablation fluence, there is the relation $OA_1=OA_2$ and the distribution has axisymmetry. A hole is dug by the ablation in the central side of the distribution where the laser fluence is not less than the threshold value at which a workpiece is ablated. The energy density is higher as the position is closer to the center. Thus, there is a tendency that a portion closer to the center is dug deeper. Accordingly, the wall surface of the hole is inclined as shown in FIG. 2. FIG. 2 is a cross section showing a workpiece 1 immediately after a hole 5 is opened. After hole 5 is made through from the front surface to the rear surface of workpiece 1, even the peripheral edge of the laser beam having a lower fluence causes ablation as long as the fluence is equal to or larger than the ablation threshold value. Therefore, it is considered that, as the number of pulse shots increases, the hole is further dug gradually and finally the taper angle becomes 0° C. (straight). As a matter of fact, however, this does not occur. Specifically, the taper angle does not approach zero even if the number of pulse shots is increased, and a certain taper angle remains.

Considering these phenomena, the present inventors reached an idea that "while the phenomena cause an inclined surface to be formed by initial shots, the laser fluence used for the ablation is lower at the inclined surface as compared with the case where the laser beam is applied to a flat surface; i.e., the amount of energy absorbed at the inclined surface is smaller and thus the energy applied to the ablation decreases". According to this idea, the laser fluence used for the ablation decreases at the material of the inclined portion. At the inclined portion, a region absorbing energy less than the ablation threshold value somewhat extends toward the center. Then, in the region absorbing energy less than the ablation threshold value, the hole is not dug even if the number of pulse shots is increased.

Figure 3:
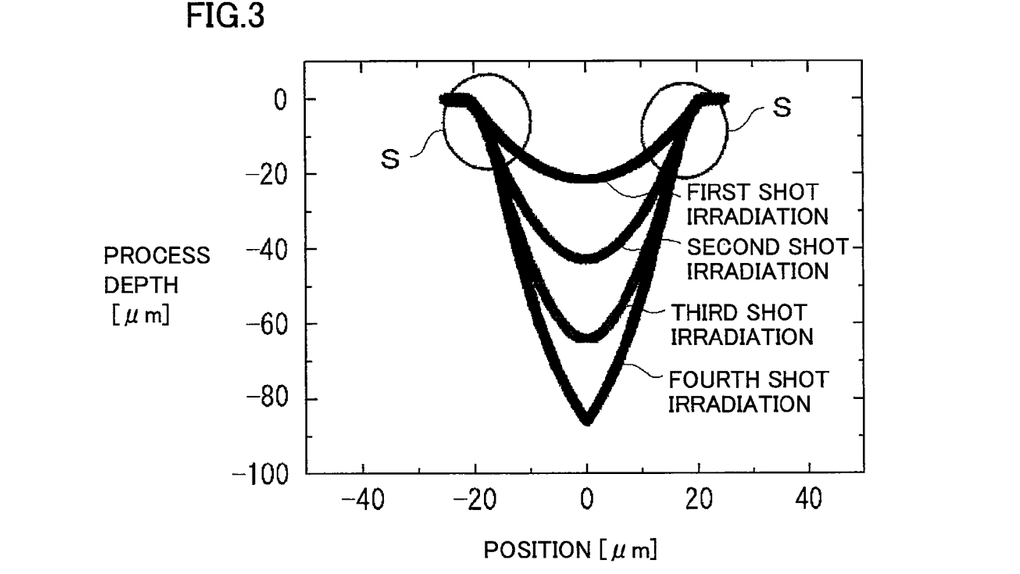
FIG. 3 is a diagram showing a simulation result illustrating the shape of the opening that changes depending on increase in number of pulsed laser shots.

Regarding the case where pulsed laser processing by means of a titanium-sapphire laser is performed on a workpiece of fluorocarbon resin (porous structure), the above-described idea was verified by calculations (simulations) and experiments. FIG. 3 shows the results of calculations based on the above-described idea, illustrating the shape of a hole that is dug down during irradiation of a first shot to a fourth shot of a pulsed laser beam. A wall surface having a gentle slope is formed in a region located somewhat closer to the center relative to another region that is near a peripheral edge of a laser beam cross section where the fluence is less than the ablation threshold value. In a region indicated by a circle S, there is formed the wall surface with the gentle slope. The wall surface with the gentle slope is little ablated by the first to fourth shots, so that the gentle slope is held as it is. Thus, near the tail of the fluence distribution, there is a portion where positions of the walls formed by the first to fourth shots respectively are unchanged and overlap each other. The overlapped portion little changes and remains even if the number of shots is increased after the hole is opened through the workpiece. In summary, the following phenomenon could be confirmed through the calculations (simulations). There is caused the peripheral portion of hole where the taper angle of a sectional shape of the hole is large. This portion of a large taper angle corresponds to a through-hole wall portion Wa described in the following in connection with the results of experiments (FIG. 10 (a), (b)).

A hole was actually formed by means of a titanium-sapphire laser (conventional example), and a cross-sectional shape thereof was observed with an SEM (Scanning Electron Microscope). FIG. 10 (a) is an SEM image of the conventional example, and FIG. 10 (b) is a schematic illustration thereof. In a through-hole 105 of a workpiece 101, a hole diameter Da at the front surface that has been irradiated with the laser beam is considerably larger than a hole diameter Db at the rear surface. At a wall surface Wa on the front side of through-hole 105, the diameter increases as approaching the front surface. At a wall surface Wb on the rear side of the through-hole, the diameter is substantially unchanged continuously and thus the shape is straight-like. There is a curved portion Ws that is inwardly convex and overlaps wall surfaces Wa and Wb. The portion of wall surface Wa corresponds to the wall surface portion having a gentle slope in region S of FIG. 3, and expands like the opening end of a trumpet as approaching the front surface.

Regarding formation of a through-hole in a workpiece by using a pulsed laser beam, the present inventors come up with a method according to which a removable sacrifice layer is provided on a workpiece, a through-hole is formed in the workpiece by the laser beam in the state where the sacrifice layer is provided, and then the sacrifice layer is removed from the workpiece after the thorough hole is formed. As described above, the sacrifice layer is provided before the laser processing and is removed after the laser processing, and accordingly the portion of Wa and further the portion of Ws can be mainly included in the sacrifice layer and then can be removed. The magnitude of thickness t of the sacrifice layer can be appropriately selected depending on the required dimensional accuracy of the through-hole. Consequently, it becomes possible to form a substantially straight-like (taperless) through-hole. Further, since the sacrifice layer is removed after the laser processing, it is possible to completely remove scattered fragments attached to the surface of the sacrifice layer as well as burrs or the like protruding from the edge of the opening.

As for a method of providing a sacrifice layer on a surface of a subject material (workpiece), any method may be used as long as no interspace is caused when a laser beam is applied.

For example, on a workpiece of a fluorocarbon resin (porous structure), a sacrifice layer of the same material can be placed by fusion bonding (bonding surfaces are fused and then cooled so as to bond together). In the case of placing a sacrifice layer of (a Ti thin film+a fluorocarbon resin layer) on a workpiece of a metal such as Ti, the placing can be done with electrostatic force. Specifically, in the case of an ultrathin sheet, electrostatic force is generated therein and thus it is possible to simply put the sacrifice layer on the workpiece so as to adhere to each other. Alternatively, the sacrifice layer may be attached to the workpiece with an adhesive for example.

Figure 4:
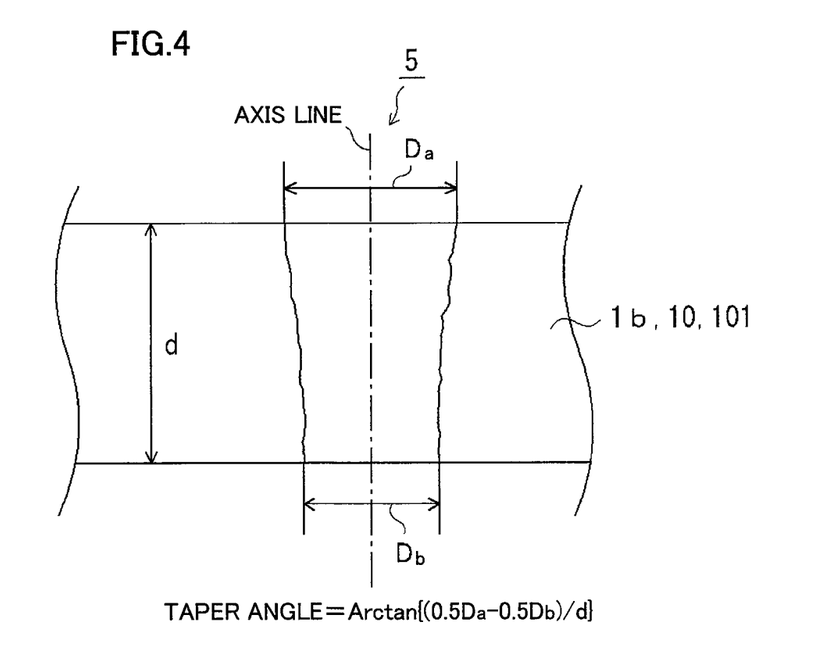
FIG. 4 illustrates a definition of a taper angle.

The above-described method may be applied to a workpiece to fabricate a product having a through-hole as described below. In a product having a through-hole of the present invention, the through-hole is provided by means of a pulsed laser, and taper angle θ of the through-hole is reduced to form a straight-like shape. Here, taper angle θ is defined as taper angle θ=Arctan $\{(0.5 \ Da - 0.5 \ Db)/d\}$ under the condition that there is the axisymmetry as described above. Da and Db represent diameters of openings at the front and the rear surfaces, respectively. Further, d represents the thickness of product 10, base film 1b or workpiece 101. Each of opening diameters Da and Db is an average value obtained from at least three times measurements. Thickness d is also similarly measured. Since taper angle θ of the through-hole of the present invention is small, substantially the same result can be obtained even if radian is used as the unit of angle so as to use approximation of taper angle θ (radian)=(0.5 Da−0.5 Db)/d. Accordingly, in a process of forming an electrically conductive portion in a thickness direction of a multilayer board whose wiring density has been increasing recently, it becomes possible to prevent defective plating on the through-hole wall surface and form the electrically conductive portion for highly reliable electrical connection.

With use of the above-described fabricating method, another product having a through-hole according to the present invention can have a straight-like through-hole. The definition of straight-like is the one as described above. In still another product having a through-hole according to the present invention, the through-hole wall surface does not includes a curved portion that is inwardly convex at one end of the through-hole such that the diameter of the through-hole increases as approaching the opening at that end. This through-hole specifically refers to a through-hole formed by a pulsed layer without including curved portion Ws in FIG. 10.

The product having the through-hole formed by the pulsed laser as described above can have a straight-like through-hole. Therefore, in a process of forming an electrically conductive portion in a thickness direction of a multilayer board whose wiring density has been increasing recently, for example, it becomes possible to prevent defective plating on the through-hole wall surface and obtain the electrically conductive portion for highly reliable electrical connection. It is possible to achieve the structure that does not include protruded portions (such as burrs) at the edge of the through-hole opening and does not include attachment of scattered fragments due to laser aberration.

EXAMPLES

Example 1

1. Shape of Through-Hole

A hole was formed by a pulsed laser in workpiece 1 including base film 1b provided with sacrifice layer 1a. The thickness of fluorocarbon resin of base film 1b was 150 μm and the thickness of fluorocarbon resin layer of sacrifice layer 1a was 30 μm. While base film 1b and sacrifice layer 1a were made of the same material in this Example, they may be made of different materials respectively as described above.

Figure 5:
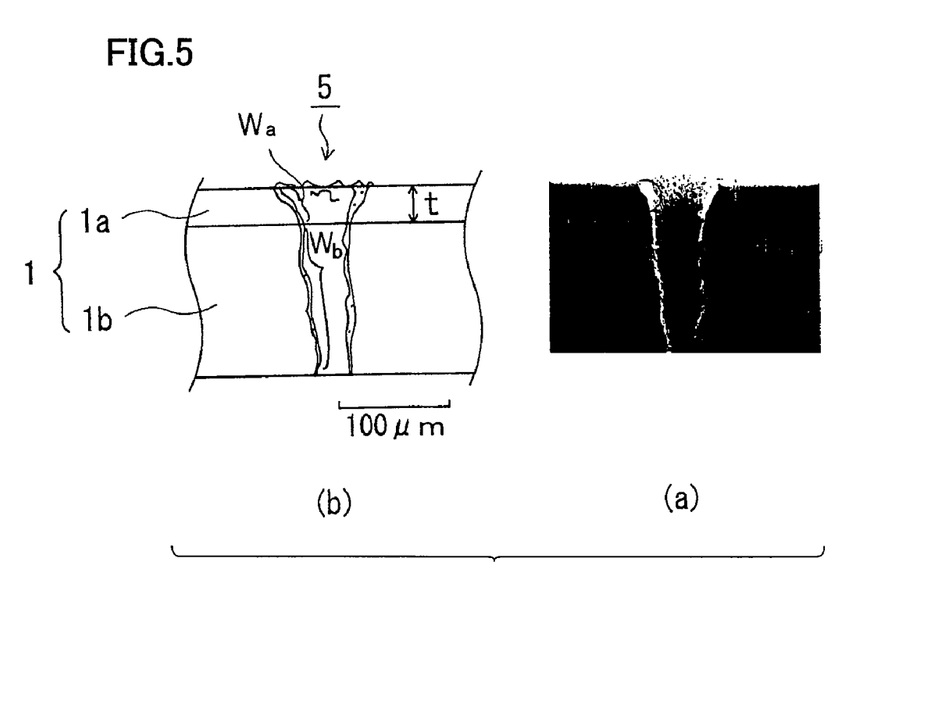
FIG. 5 is a diagram showing a state of a through-hole opened by a pulsed laser with a sacrifice layer being provided, in manufacturing a product having the through-hole in Example A of the present invention, where (a) shows an SEM image of a through-hole cross section and (b) shows a schematic diagram thereof.
Figure 6:
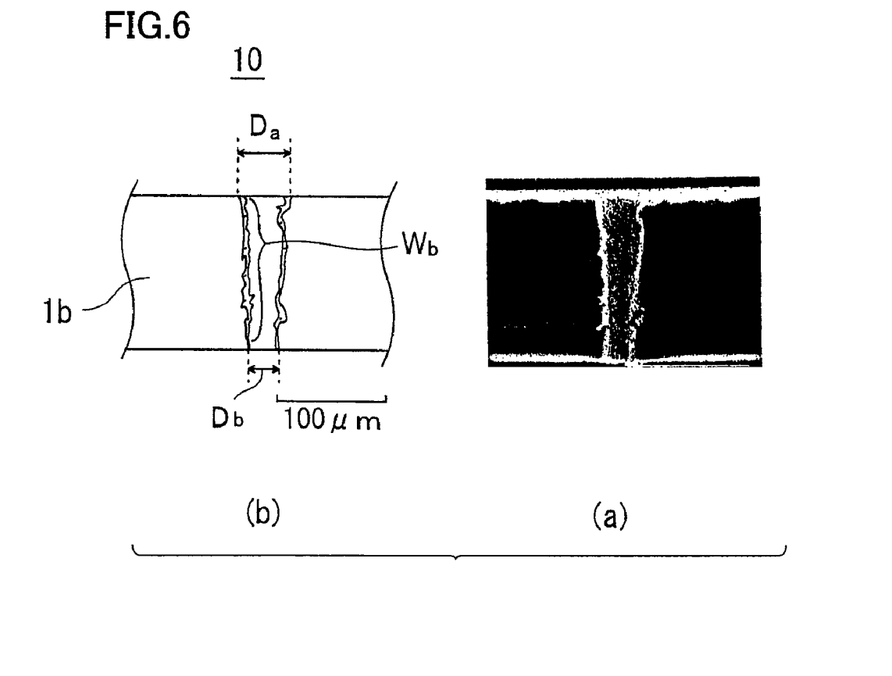
FIG. 6 is a diagram showing a state of the through-hole in which the sacrifice layer in the state of FIG. 5 is removed, where (a) shows an SEM image of the through-hole cross section and (b) shows a schematic diagram thereof.

FIGS. 5 and 6 illustrate a process of forming a through-hole of Example A of the present invention. FIG. 5 (a), (b) show a state where through-hole 5 is formed by a pulsed laser in workpiece 1 in which sacrifice layer 1a of fluorocarbon resin of 30 μm thickness is provided on base film 1b of fluorocarbon resin of 150 μm thickness. FIG. 5 (a) shows an image of an SEM cross section, and FIG. 5 (b) shows a schematic illustration thereof. According to these diagrams, the portion of wall surface Wa where the diameter expands as approaching the front surface is included in sacrifice layer 1a of thickness t and is removed afterwards. FIG. 6 (a) shows an SEM image of base film 1b or product 10 after sacrifice layer 1a is removed, and FIG. 6 (b) shows a schematic illustration thereof. Product 10 having the through-hole or base film 1b thus includes the through-hole formed with straight-like wall surface Wb. While the taper angle in the state of FIG. 5 (a), (b) was 5.1°, the taper angle is reduced to 3.0° in the state of FIG. 6 (a), (b).

With product 10 including the straight-like through-hole, in a process of forming an electrically conductive portion in a thickness direction of a multilayer board whose wiring density has been increasing recently, it is possible to prevent defective plating on the through-hole wall surface and form the electrically conductive portion for highly reliable electrical connection. Further, it is also possible to provide the product not including burrs and scattered fragments, as described in detail hereinlater.

Figure 7:
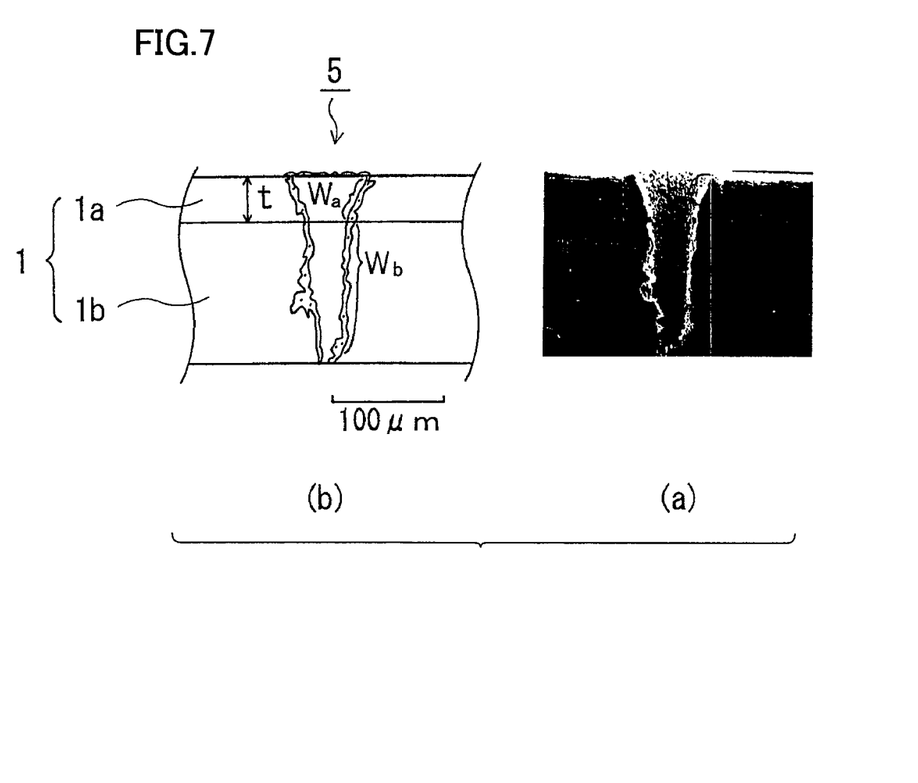
FIG. 7 is a diagram showing a state of a through-hole opened by a pulsed laser with a sacrifice layer being provided, in manufacturing a product having the through-hole in Example B of the present invention, where (a) shows an SEM image of a through-hole cross section and (b) shows a schematic diagram thereof.
Figure 8:
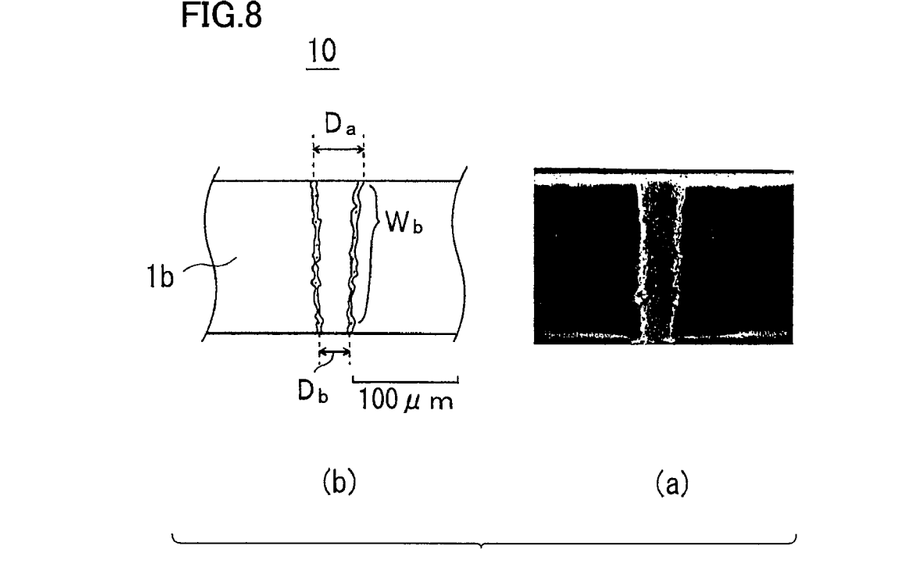
FIG. 8 is a diagram showing a state of the through-hole in which the sacrifice layer in the state of FIG. 7 is removed, where (a) shows an SEM image of the through-hole cross section and (b) shows a schematic diagram thereof.

FIGS. 7 and 8 illustrate a process of forming a through-hole of Example B of the present invention. Example B of the present invention is basically the same as Example A of the present invention. Specifically, FIGS. 7 (a) and (b) are each a diagram showing a state where through-hole 5 is formed by means of a pulsed laser in workpiece 1 in which sacrifice layer 1a of fluorocarbon resin of 30 μm thickness is provided on base film 1b of fluorocarbon resin of 150 μm thickness. FIG. 7 (a) is an SEM cross-sectional image, and FIG. 7 (b) is a schematic illustration thereof. According to FIG. 7 (a), the portion of wall surface Wa where the diameter expands as approaching the front surface is included in sacrifice layer 1a of thickness t and is removed after the through-hole is formed. FIG. 8 (a) shows an SEM image of base film 1b or product 10 having the through-hole after sacrifice layer 1a is removed, and FIG. 8 (b) is a schematic illustration thereof. Base film 1b or product 10 having the through-hole is thus formed by straight-like wall surface Wb. While the taper angle in the state of FIG. 7 (a), (b) was 5.1°, the taper angle in the state of FIG. 8 (a), (b) was 3.0°. This product having the through-hole provides the advantages as described above.

In contrast, in the conventional example as shown in FIG. 10 (a), (b), there is wall surface Wa having a large taper angle in the portion corresponding to the periphery of the laser beam and located on the front side of through-hole 105. Further, there is curved portion Ws that is inwardly convex between straight-like portions Wb and Wa and overlapping these portions. Wall surface Wa having a large taper angle and corresponding to the periphery of the laser beam as described above corresponds to the portion of the wall surface where the hole is not further dug and the wall portions overlap each other while the first to fourth shots are applied as shown in FIG. 3. Because of the presence of portion Wa having a large taper angle, straight-like portion Wb and curved portion Ws overlapping both of the other portions, defectiveness is caused in plating for forming an electrically conductive portion and thus the reliability of the wiring board is deteriorated. Examples A and B of the present invention cause no defectiveness in plating since portion Wa of a large taper angle is completely removed from the through-hole as shown in FIG. 6 (a), (b) and FIG. 8 (a), (b).

2. Burrs and Scattered Fragments

Figure 9:
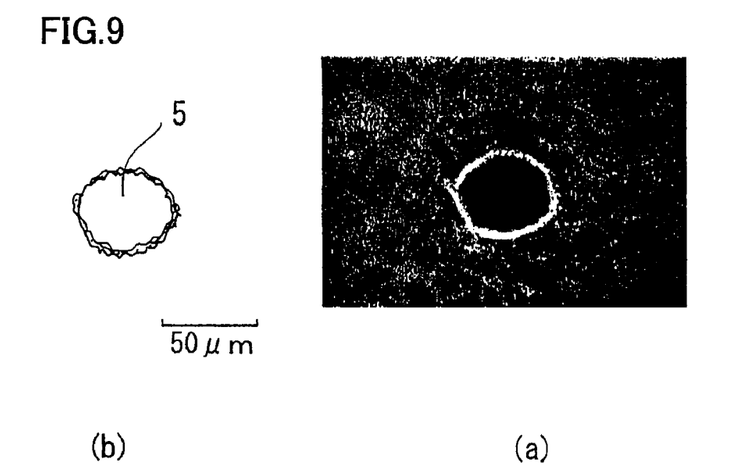
FIG. 9 is a diagram showing a front surface of the product having the through-hole in Example A of the present invention, where (a) shows an SEM image of a through-hole cross section and (b) shows a schematic diagram thereof.

FIGS. 9 (a) and (b) each illustrate the front surface of the product having the through-hole of Example A of the present invention (the front surface of FIG. 6 (a), (b)). In contrast, FIGS. 11 (a) and (b) each illustrate the front surface of the product having the through-hole in FIG. 10 (a), (b). In each of FIGS. 11 and 9, (a) shows an SEM image of a through-hole cross section, and (b) shows a schematic illustration thereof. As shown in FIG. 11 (a), (b), burrs 125 are formed on the peripheral edge of the opening at the front surface of through-hole 105, and scattered fragments 126 are also attached thereon. In contrast, in Example A of the present invention, there is no scattered fragments or burrs on the front surface of base film 1b or product 10 having the through-hole after the sacrifice layer is removed.

Example 2

Relation between Taper Angle, Laser Diameter and Thickness of Workpiece

Figure 12:
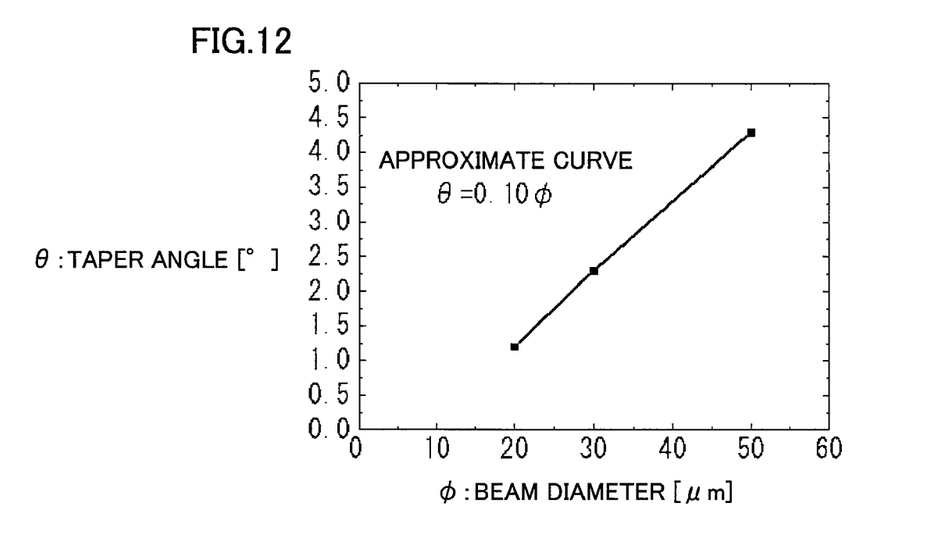
FIG. 12 is a diagram showing the dependency of the taper angle on the laser beam diameter.
Figure 13:
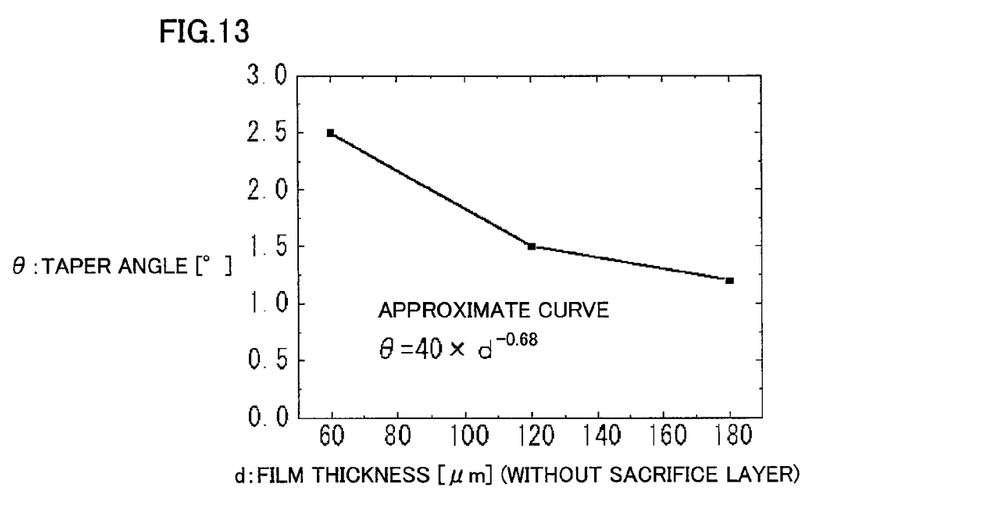
FIG. 13 is a diagram showing the dependency of the taper angle on the base film thickness.

In the case that a through-hole is formed with a sacrifice layer provided, the taper angle is strongly influenced by laser beam diameter $\phi$ and thickness d of the base film (subject material) (although the taper angle even in the case of forming a through-hole with no sacrifice layer is also influenced by above-described $\phi$ and d, it is influenced in different manners). FIG. 12 is a diagram showing a dependency of taper angle $\theta$ (°) on laser diameter $\theta$ (μm), and it is seen that the taper angle (°) is proportional to the laser diameter $\phi$ (μm). FIG. 13 is a diagram showing a dependency of taper angle $\theta$ (°) on base film thickness d (μm), and it is seen that the taper angle (°) is proportional to the base film thickness $\{d\,(\mu m)\}^{-0.68}$.

Expression (1)=$(\theta \times d^{0.68})/\phi$ is provided here. Then, expression (1) can be regarded as the one indicating the magnitude of taper angle $\theta$ considering base film thickness d and laser diameter $\phi$ (i.e., corrected with base film thickness d and laser diameter $\phi$). Experimental data corresponding to the plots in above-described FIGS. 12 and 13 are summarized in Table 1 and Table 2. Table 1 shows the results regarding the process of forming a through-hole in a base film (workpiece or subject material) of PTFE (polytetrafluoroethylene), and Table 2 shows the results regarding the process of forming a through-hole in a base film of Ti.

TABLE 1

(workpiece: PTFE)

| | sacrifice layer present/absent | d: thickness of base film [μm] | $\phi$: laser beam diameter [μm] | $\theta$: taper angle [°] | value of expression (1) |
|---|---|---|---|---|---|
| Invention's Example 1 | present: PTFE | 180 | 20 | 0.5-2.5 | 0.85-4.27 |
| Invention's Example 2 | present: PTFE | 60 | 20 | 1.9-3.1 | 1.54-2.51 |
| Invention's Example 3 | present: PTFE | 120 | 20 | 1.4-1.8 | 1.82-2.33 |
| Invention's Example 4 | present: PTFE | 180 | 30 | 1.5-3.5 | 1.71-3.99 |
| Invention's Example 5 | present: PTFE | 180 | 50 | 3.5-6.0 | 2.39-4.10 |
| Comparative Example 1 | absent | 30 | 20 | 8-13 | 4.04-5.05 |
| Comparative Example 2 | absent | 120 | 20 | 3.6-5.7 | 4.67-7.40 |
| Comparative Example 3 | absent | 180 | 20 | 2.5-3.7 | 4.27-6.32 |
| Comparative Example 4 | absent | 240 | 20 | 2.2-2.6 | 4.57-5.40 | note 1:
expression (1) = $(\theta \times d^{0.68})/\phi$

TABLE 2

(workpiece: Ti)

| | sacrifice layer present/absent | d: thickness of base film [μm] | $\phi$: laser beam diameter [μm] | $\theta$: taper angle [°] | value of expression (1) |
|---|---|---|---|---|---|
| Invention's Example 6 | present: one Ti layer | 20 | 28.5 | 5-21 | 1.35-5.65 |
| Invention's Example 7 | present: two Ti layers | 20 | 28.5 | 4-12 | 1.08-3.23 |
| Comparative Example 5 | absent | 20 | 26.7 | 21-55 | 6.03-15.80 | note 1:
expression (1) = $(\theta \times d^{0.68})/\phi$

In each of Invention's Examples 1 to 5 shown in Table 1, PTFE that is the same material as that of the base film is used for the sacrifice layer for the following reasons. It is considered that it is natural to use the sacrifice layer of the same material as that of the base film to be processed. In addition, even if it is attempted to select another material, it is difficult to find a material having a higher ablation threshold value than the very high ablation threshold value of the PTFE of the workpiece. In Table 2, there are shown the case where one sacrifice layer of Ti that is the same material as the material Ti of the workpiece is provided (Invention's Example 6) and the case where two sacrifice layers are provided (Invention's Example 7). The fluorocarbon resin has an ablation threshold value of 0.44 J/cm$^2$ and Ti has an ablation threshold value of 0.05 J/cm$^2$.

Referring to the values of expression (1) in Table 1 and Table 2, in the case that the value of expression (1) is not more than 4.0, taper angle θ itself is small, and thus it can be said that the processed product has a taperless through-hole or straight-like through-hole. In some embodiments of the present invention, the value of not more than 4.0 of expression (1) is derived from FIGS. 12 and 13 and the data in Table 1 and Table 2.

Example 3

Formation of Through-Hole in Ti Film

Figure 14:
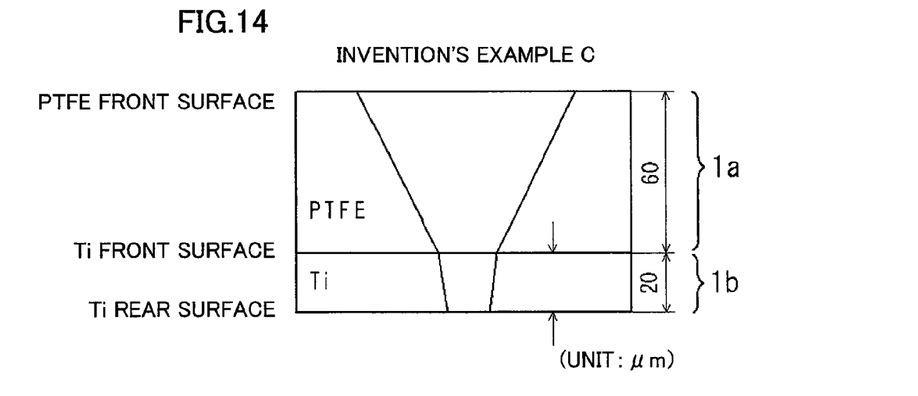
FIG. 14 is a diagram showing a sacrifice layer etc. of Example C in Example 3 of the present invention.
Figure 15:
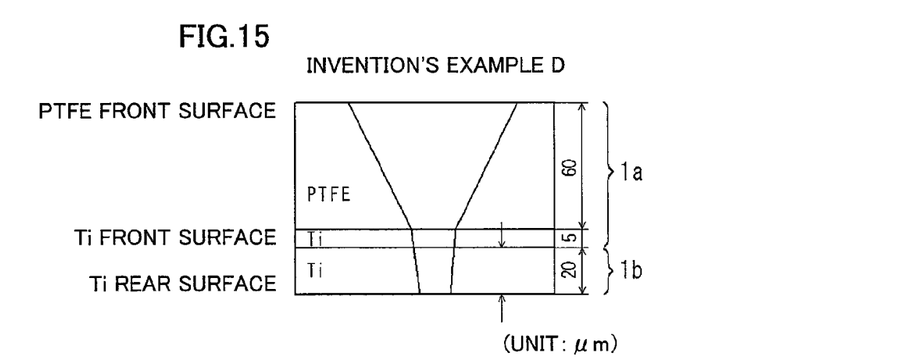
FIG. 15 is a diagram showing a sacrifice layer etc. of Example D in Example 3 of the present invention.
Figure 16:
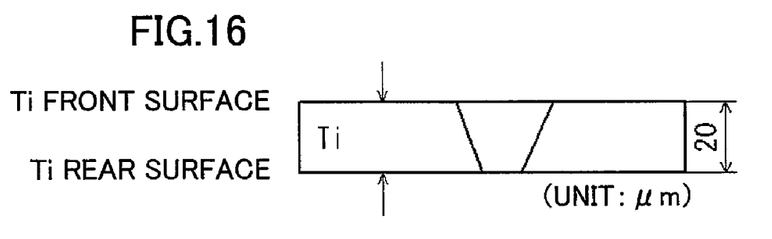
FIG. 16 is a diagram showing a base film of a comparative example in Example 3.

In Example 3 of the present invention, laser processing was performed to provide a through-hole in a Ti base film of 20 μm thickness. FIGS. 14 and 15 show respective structures each including sacrifice layer 1a and base film 1b in Example C and Example D of the present invention. In Example C of the present invention, PTFE of 60 μm thickness was used for sacrifice layer 1a. In Example D thereof a combination of Ti of 5 μm thickness and PTFE of 60 μm thickness was used for sacrifice layer 1a. In consideration of the fact that the sacrifice layer of a porous PTFE causes scattering and transmission of incident light and thus the effect of the sacrifice layer is lessened, Ti (5 μm) was used as a shield for preventing transmission of the light. Then, such a Ti base film with no sacrifice layer as shown in FIG. 16 is used as a comparative example. Table 3 and Table 4 show laser parameters and the like for Examples C and D of the present invention and the comparative example.

TABLE 3

| Laser Parameters and Material | (Invention's Examples C, D) |
|---|---|
| laser wavelength | 800 nm |
| laser repetition frequency | 10 Hz |
| laser pulse width | 120 fs |
| laser energy | 54-0.35 μJ |
| workpiece (base film) | Ti (99.5%), thickness: 20 μm, purchased from Nilaco Corporation (model number: Ti-453212) |

TABLE 4

| Laser Parameters and Material | (Comparative Example) |
|---|---|
| laser wavelength | 800 nm |
| laser repetition frequency | 10 Hz |
| laser pulse width | 160 fs |
| laser energy | 31-2.65 μJ |
| workpiece (base film) | Ti (99.5%), thickness: 20 μm, purchased from Nilaco Corporation (model number: Ti-453212) |

Table 5 shows the result for the through-hole in Example C of the present invention in the case that the laser energy is 30 μJ or 10 μJ. Table 6 shows the result for the through-hole in Example D of the present invention in the case that the laser energy is 15 μJ, 10 μJ or 8 μJ. It is seen from Table 5 and Table 6 that there is a tendency that the taper angle is smaller as the laser energy is smaller, and the effect of providing two layers (Ti/PTFE) as the sacrifice layer can be confirmed to some degree.

TABLE 5

| | | (Invention's Example C) | |
|---|---|---|---|
| sacrifice layer PTFE | energy (μJ) | 30 | 10 |
| | process diameter (μm) (PTFE front surface) | 37-49 | 22-26 |
| | taper angle (°) | 3-9 | 2-5 |
| workpiece Ti | energy (μJ) | 30 | 10 |
| | process diameter (μm) (20 μm, Ti front surface) | 19-25 | 15-19 |
| | process diameter (μm) (20 μm, Ti rear surface) | 15-20 | 10-12 |
| | taper angle (°) | 6-21 | 5-11 |

TABLE 6

| | | (Invention's Example D) | | |
|---|---|---|---|---|
| sacrifice layer PTFE | energy (μJ) | 15 | 10 | 8 |
| | process diameter (μm) (PTFE front surface) | 29-34 | 22-26 | 20-22 |
| | taper angle (°) | — | — | — |
| workpiece Ti | energy (μJ) | 15 | 10 | 8 |
| | process diameter (μm) (20 μm, Ti front surface) | 16-20 | 9-15 | 7-10 |
| | process diameter (μm) (20 μm, Ti rear surface) | 10-13 | 4-7 | 4 |
| | taper angle (°) | 7-11 | 5-12 | 4-8 |

TABLE 7

| | (Comparative Example) | |
|---|---|---|
| energy (μJ) | 31 | 23 |
| process diameter (μm) (20 μm, Ti front surface) | 80 (max)-77 (min) | 44-42 |
| process diameter (μm) (20 μm, Ti rear surface) | 24-19 | 26-21 |
| taper angle (°) | 55-53 | 29-23 |

TABLE 8

| | (Comparative Example) | | |
|---|---|---|---|
| energy (μJ) | 10 | 5 | 2.65 |
| process diameter (μm) (20 μm, Ti front surface) | 40-38 | 36-34 | 34-33 |
| process diameter (μm) (20 μm, Ti rear surface) | 21-19 | 19-15 | 18-15 |
| taper angle (°) | 22-26 | 26-22 | 24-21 |

On the other hand, Table 7 and Table 8 show the results for the through-holes in the comparative examples. For example, when respective results concerning the laser energy of 10 μJ are compared with each other, it is seen that the taper angles of Examples C and D of the present invention are particularly reduced and improved to be as small as ½ to ¼ compared with those of the comparative examples. When respective results concerning the laser energy of approximately 30 μJ are compared with each other, the taper angle of Example C of the present invention is 6 to 21° as shown in Table 5, while the taper angle of the comparative example of Table 7 is 55 to 53°. Thus, it is possible to confirm the remarkable effect of improvement in Example C of the present invention. Further, the taper angle in Table 8 is 26 to 22° for the laser energy of 10 μJ to 5 μJ. In Example D in Table 6, the taper angle is 8 to 4° for the laser energy of 8 μJ. Therefore, it can be said that dramatic improvements are achieved in forming a taperless through-hole in any of Examples of the present invention.

Figure 17:
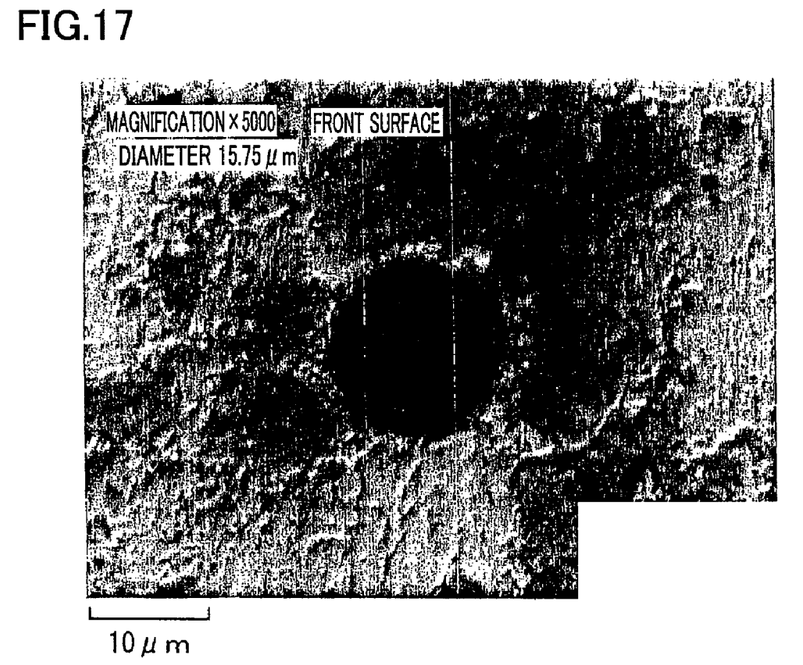
FIG. 17 is a diagram showing a processed diameter at a front surface of a base film in Example D of the present invention.
Figure 18:
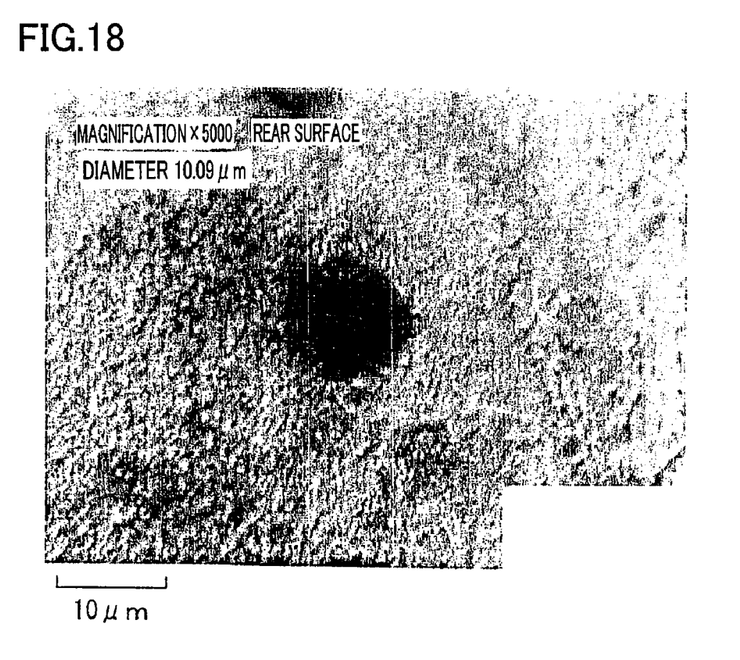
FIG. 18 is a diagram showing a processed diameter at a rear surface of the base film in Example D of the present invention.
Figure 19:
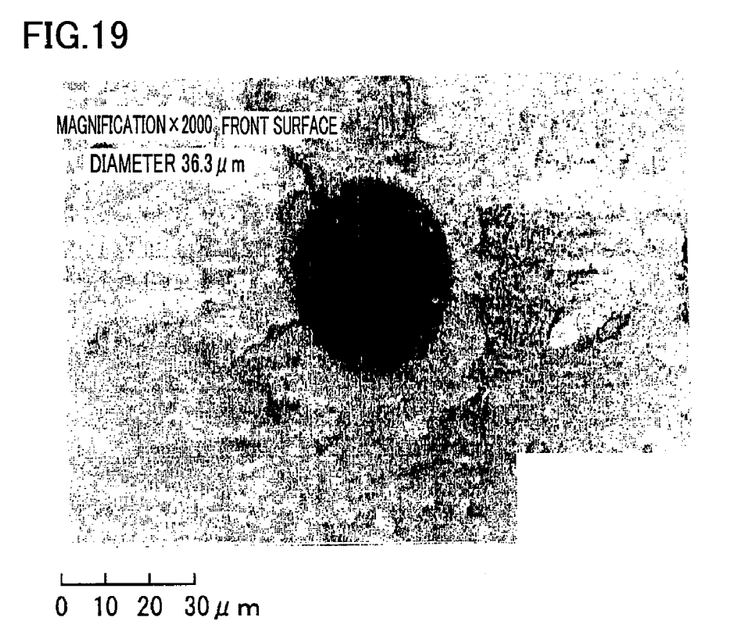
FIG. 19 is a diagram showing a processed diameter at a front surface of a base film in a comparative example.
Figure 20:
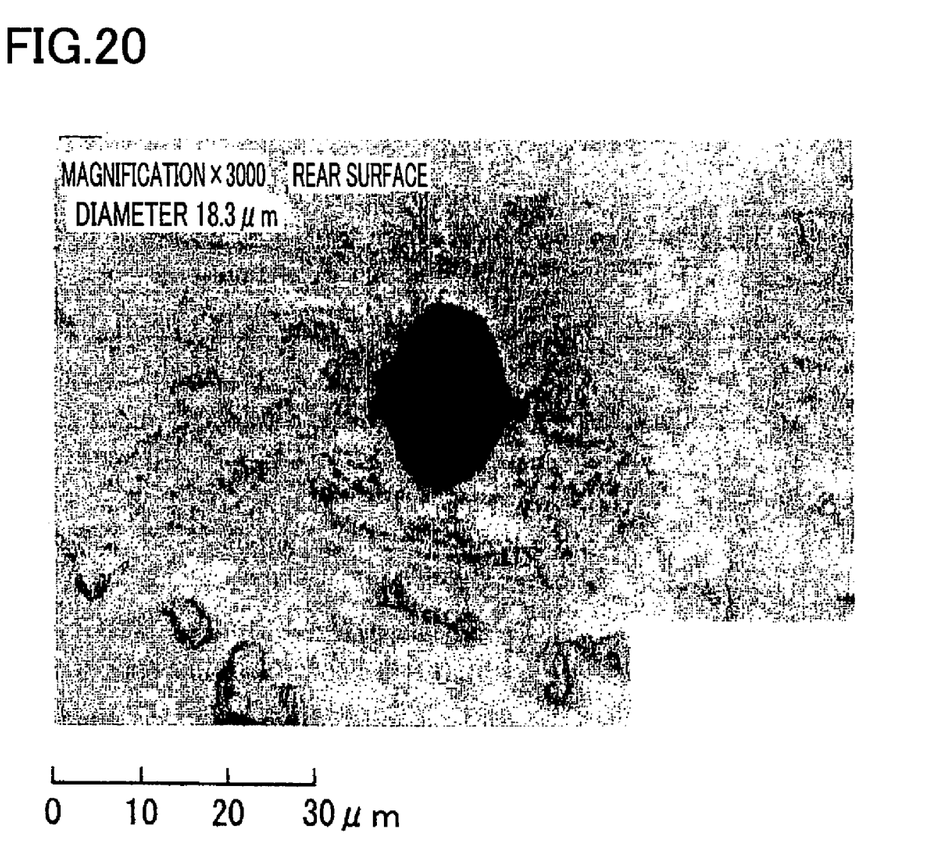
FIG. 20 is a diagram showing a processed diameter at a rear surface of the base film in the comparative example.

FIGS. 17 and 18 show respective process diameters at the front and rear surfaces of the base film (Ti) regarding the laser energy of 15 μJ in Example D of the present invention. FIGS. 19 and 20 show respective process diameters at the front and rear surface of the base film (Ti) regarding the laser energy of 5 μJ in the comparative example. As seen from Example 1 as well, in the case that the sacrifice layer is not used, burrs are formed and scattered fragments are also found near the peripheral edge of the hole at the front surface of the base film. In terms of the circularity of hole as well, it is seen that the comparative examples are inferior to Example D of the present invention.

While embodiments and examples of the present invention have been explained above, the embodiments and examples of the present invention disclosed above are provided merely by way of illustration and example, and the scope of the present invention is not limited to these embodiments of the invention. The present invention includes, in its technical scope, all of laser processing methods according to which a portion influenced by the inclined surface generated in the process of applying initial pulsed laser shots still remains in the subsequent process of applying shots, and is included in the sacrifice layer even to a smaller extent. The scope of the present invention is defined by claims and includes all modifications in meaning equivalent to and in the scope of the claims.

INDUSTRIAL APPLICABILITY

The present invention can provide a product having a straight-like through-hole and a laser processing method that can reduce a taper angle in the through-hole and avoid burr and attachment of scattered fragments on the product. Therefore, the invention can prevent defective plating on a through-hole wall surface in a multilayer board and contribute to supply of highly reliable multilayer board or the like.

The invention claimed is:

1. A laser processing method for forming a through-hole in a workpiece by means of a pulsed laser beam, the method comprising steps of:
providing a removable sacrifice layer on said workpiece;
forming the through-hole in said workpiece and said sacrifice layer by the laser beam in a state where said sacrifice layer is provided, the laser beam being applied to said workpiece through said sacrifice layer; and
removing said sacrifice layer from said workpiece after said step of forming the through-hole, wherein:
an ablation threshold value of said sacrifice layer is not less than an ablation threshold value of said workpiece,
the through-hole has a taper angle $\theta$ (°)=arctan $\{(0.5\ Da-0.5\ Db)/d\}$, where Da (μm) and Db (μm) respectively represent a diameter of front and rear openings of the through-hole, and d (μm) represents a thickness of said workpiece, and
$(\theta \times d^{0.68})/\phi \leq 4.0$ is satisfied where $\phi$ (μm) denotes a diameter of said laser beam.

2. The laser processing method according to claim 1, wherein said sacrifice layer includes a plurality of layers.

3. A laser processing method for forming a through-hole in a workpiece by means of a pulsed laser beam, the method comprising steps of:
providing a removable sacrifice layer on said workpiece;
forming the through-hole in the workpiece and the sacrifice layer by the laser beam in a state where said sacrifice layer is provided, the laser beam being applied to the workpiece through the sacrifice layer; and
removing said sacrifice layer from said workpiece after the step of forming the through-hole, wherein:
the sacrifice layer includes a first layer disposed on the workpiece and a second layer disposed on the first layer,
an ablation threshold value of the second layer is not less than an ablation threshold value of the workpiece and is smaller than an ablation threshold value of the first layer,
the through-hole has a taper angle $\theta$ (°)=arctan $\{(0.5\ Da-0.5\ Db)/d\}$, where Da (μm) and Db (μm) respectively represent a diameter of front and rear openings of the through-hole, and d (μm) represents a thickness of said workpiece, and
$(\theta \times d^{0.68})/\phi \leq 4.0$ is satisfied where $\phi$ (μm) denotes a diameter of said laser beam.

* * * * *